(12) United States Patent
Lin et al.

(10) Patent No.: US 10,564,540 B2
(45) Date of Patent: Feb. 18, 2020

(54) METHOD OF USING EQUIPMENT METHOD AND SYSTEM FOR MANUFACTURING MASK OR DISPLAY SUBSTRATE

(71) Applicants: BOE Technology Group Co., Ltd., Beijing (CN); Ordos Yuansheng Optoelectronics Co., Ltd., Inner Mongolia (CN)

(72) Inventors: Zhiming Lin, Beijing (CN); Zhen Wang, Beijing (CN); Jian Zhang, Beijing (CN); Chun Chieh Huang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 24 days.

(21) Appl. No.: 15/560,086

(22) PCT Filed: Mar. 9, 2017

(86) PCT No.: PCT/CN2017/076087
§ 371 (c)(1),
(2) Date: Sep. 20, 2017

(87) PCT Pub. No.: WO2018/076591
PCT Pub. Date: May 3, 2018

(65) Prior Publication Data
US 2018/0307134 A1 Oct. 25, 2018

(30) Foreign Application Priority Data
Oct. 31, 2016 (CN) .......................... 2016 1 0929809

(51) Int. Cl.
*G03F 1/74* (2012.01)
*G03F 1/72* (2012.01)
(Continued)

(52) U.S. Cl.
CPC .................. *G03F 1/72* (2013.01); *G03F 1/44* (2013.01); *G03F 7/70508* (2013.01); *H01L 21/682* (2013.01); *G02F 1/1303* (2013.01)

(58) Field of Classification Search
CPC ....................................................... G03F 1/72
(Continued)

(56) References Cited

U.S. PATENT DOCUMENTS 6,295,083 B1 * 9/2001 Kuhn .................... G06T 7/0002
348/180
6,557,163 B1 4/2003 Rankin et al.
(Continued)

FOREIGN PATENT DOCUMENTS

CN 1596384 A 3/2005
CN 1749851 A 3/2006
(Continued)

OTHER PUBLICATIONS

International Search Report and Written Opinion, including English translations of International Search Report and Box V of the Written Opinion, for International Application No. PCT/CN2017/076087, dated Mar. 9, 2017, 16 pages.
(Continued)

*Primary Examiner* — Tarifur R Chowdhury
*Assistant Examiner* — Omar H Nixon
(74) *Attorney, Agent, or Firm* — Westman, Champlin & Koehler, P.A.

(57) ABSTRACT

The present disclosure relates to a method of using an equipment for manufacturing or using a mask or a display substrate; and the method includes: providing a master plate;
(Continued)

setting, on the master plate, a plurality of measuring points corresponding to positions of the mask or the display substrate where a pixel position accuracy measurement is to be implemented, according to the mask or the display substrate to be measured; and placing the master plate in a coordinate system of the equipment, and measuring error values between the equipment and the master plate at the measuring points.

12 Claims, 6 Drawing Sheets

(51) Int. Cl.
*G03F 7/20* (2006.01)
*G03F 1/44* (2012.01)
*H01L 21/68* (2006.01)
*G02F 1/13* (2006.01)

(58) Field of Classification Search
USPC .................................................. 356/237.5
See application file for complete search history.

(56) References Cited

U.S. PATENT DOCUMENTS

| | | |
|---|---|---|
| 7,422,828 B1 | 9/2008 | Kim |
| 7,700,244 B2 | 4/2010 | Suzuki et al. |
| 7,998,644 B2 | 8/2011 | Suzuki et al. |
| 8,318,388 B2 | 11/2012 | Suzuki et al. |
| 8,982,320 B2 | 3/2015 | Okita |
| 2004/0150154 A1* | 8/2004 | Howe ..................... B65H 5/34 271/228 |
| 2006/0047456 A1 | 3/2006 | Conrad et al. |
| 2006/0159931 A1 | 7/2006 | Suzuki et al. |
| 2007/0010959 A1* | 1/2007 | Chang .................. G01B 21/045 702/94 |
| 2008/0106714 A1* | 5/2008 | Okita ................... G03F 7/70633 355/53 |
| 2008/1106714 | 5/2008 | Okita |
| 2010/0110176 A1* | 5/2010 | Aoyama .............. G01B 11/002 348/135 |
| 2010/0173232 A1 | 7/2010 | Suzuki et al. |
| 2011/0262847 A1 | 10/2011 | Suzuki et al. |
| 2011/0293819 A1* | 12/2011 | Lee ....................... B08B 7/0035 427/66 |
| 2014/0118531 A1* | 5/2014 | Franklin ............... G02F 1/1303 348/95 |
| 2014/0307949 A1* | 10/2014 | Eyring ................ G03F 7/70633 382/151 |
| 2016/0003677 A1* | 1/2016 | Pezzaniti .................. G01J 5/58 250/330 |
| 2016/0104413 A1* | 4/2016 | Matsueda ........... H01L 27/3218 345/694 |
| 2016/0148981 A1* | 5/2016 | Matsueda ........... H01L 27/3218 257/40 |
| 2016/0247441 A1* | 8/2016 | Matsueda ........... G09G 3/2003 |

FOREIGN PATENT DOCUMENTS

| | | |
|---|---|---|
| CN | 101006555 A | 7/2007 |
| CN | 101414130 A | 4/2009 |
| CN | 104593721 A | 5/2015 |
| CN | 104894510 A | 9/2015 |

OTHER PUBLICATIONS

First Office Action, including Search Report, for Chinese Patent Application No. 201610929809.1, dated Apr. 11, 2019, 17 pages.

* cited by examiner

METHOD OF USING EQUIPMENT METHOD AND SYSTEM FOR MANUFACTURING MASK OR DISPLAY SUBSTRATE

CROSS-REFERENCE TO RELATED APPLICATION

This application is the U.S. national phase entry of PCT/CN2017/076087, with an international filing date of Mar. 9, 2017, which claims priority to Chinese Patent Application No. 201610929809.1 filed on Oct. 31, 2016, the disclosures of which are hereby incorporated by reference in their entirety.

TECHNICAL FIELD

The present disclosure relates to a method and a system for a mask or a display substrate, and particularly, to a method and a system of using an equipment for manufacturing or using a mask or a display substrate.

BACKGROUND

Fine Metal Mask (FMM for short) is a common key component in a liquid crystal display manufacturing process, for example, it is often used in an evaporation process. In the evaporation process, accurate alignment between the FMM and a substrate (glass) should be ensured, otherwise position accuracy of a pattern to be manufactured will be adversely affected. Therefore, it needs to ensure position accuracy of the FMM in for example net machine or stretching equipment, so as to ensure accurate alignment between the FMM and the substrate.

SUMMARY

According to a first aspect of the present disclosure, there is provided a method of using an equipment for manufacturing or using a mask or a display substrate, and the method comprises:

providing a master plate;

setting a plurality of measuring points on the master plate, wherein the plurality of measuring points corresponds to positions of the mask or the display substrate where a pixel position accuracy measurement is to be implemented, according to the mask or the display substrate; and placing the master plate in a coordinate system of the equipment, and measuring error values between the equipment and the master plate at the measuring points.

In one embodiment, the method may further comprise:

compensating errors of the equipment at the measuring points with the error values obtained in the error value measuring step serving as final compensation values.

In one embodiment, the method may further comprise:

measuring deviation values between actual measurement values of the master plate and theoretical design values of the master plate at the measuring points by implementing a position accuracy check on the master plate.

In one embodiment, the method may further comprise:

compensating errors of the equipment at the measuring points with, final compensation values for compensating errors of the equipment at the measuring points, determined by combining the error values obtained in the error value measuring step at the measuring points with the deviation values obtained in the deviation value measuring step, respectively.

In one embodiment, n measuring points may be set in the measuring point setting step, in which n is a natural number greater than 2;

components of an error value at an $i^{th}$ measuring point obtained in the error value measuring step in a first coordinate system (x, y) are $\Delta x_i$ and $\Delta y_i$, respectively, in which i is a natural number in the range of 1~n;

components of the deviation value at the $i^{th}$ measuring point obtained in the deviation value measuring step in a second coordinate system (X, Y) are $\delta X_i$ and $\delta Y_i$, respectively, in which i is a natural number in the range of 1~n; and the compensating errors specifically comprises calculating the final compensation value $\Sigma X_i$, $\Sigma Y_i$ at the $i^{th}$ measuring point by the following equation:

$\Sigma X_i = \delta X_i - \Delta x_i;$ $\Sigma Y_i = \delta Y_i - \Delta y_i.$

In one embodiment, the master plate may be one selected from a standard correction plate, a glass substrate corresponding to the mask or the display substrate, or a mask product or a display substrate product.

In one embodiment, the deviation value measuring step may be implemented in advance, and then, in the error value measuring step, the measured deviation values are automatically imported into a system by which the method is implemented.

According to a second aspect of the present disclosure, there is also provided a method for manufacturing a mask or a display substrate, and the manufacturing method comprises:

generating, by implementing the method of any of the abovementioned embodiments of the first aspect, compensation data for the mask or the display substrate to be manufactured;

generating coordinates of the mask or the display substrate to be manufactured in the equipment according to the generated compensation data; and manufacturing the mask or the display substrate according to the generated coordinates.

According to a third aspect of the present disclosure, there is also provided a method for manufacturing a mask or a display substrate, and the manufacturing method comprises:

generating, by implementing the method of any of the abovementioned embodiments of the first aspect on types of masks or display substrates, respectively, compensation data files for the types of the masks or the display substrates to be manufactured;

storing the generated compensation data files into a database or a control system;

reading a specific type of the mask or the display substrate to be manufactured;

extracting the corresponding compensation data file from the database or the control system according to the specific type of the mask or the display substrate to be manufactured;

generating coordinates of the mask or the display substrate to be manufactured in the equipment according to the extracted compensation data file; and manufacturing the mask or the display substrate according to the generated coordinates.

In one embodiment, the types of the masks or the display substrates may be divided according to pixel position accuracy.

According to a fourth aspect of the present disclosure, there is further provided a system of using an equipment for manufacturing or using a mask or a display substrate, and the system comprises:

a setting module configured for: setting, on the master plate, a plurality of measuring points according to the mask or the display substrate, the plurality of measuring points corresponding to positions of the mask or the display substrate where a pixel position accuracy measurement is to be implemented; and a measuring module configured for: measuring error values between the equipment and the master plate at the measuring points.

In one embodiment, the system may further comprise: a compensation module configured for: compensating errors of the equipment at the measuring points with the error values obtained by the measuring module serving as final compensation values.

In one embodiment, the measuring module may be further configured for: measuring deviation values between actual measurement values of the master plate and theoretical design values of the master plate at the measuring points by implementing a position accuracy check on the master plate.

In one embodiment, the system may further comprise: a combining module configured for: combining the error values obtained by the measuring module at the measuring points with deviation values obtained by the measuring module at the measuring points, respectively, to determine final compensation values for compensating errors of the equipment at the measuring points.

According to a fifth aspect of the present disclosure, there is further provided an error measuring and/or compensating system for a mask or a display substrate, and the system comprises: a controller configured to carry out the method of any of the abovementioned embodiments of the first aspect; and a database including the error values between the equipment and the master plate at the measuring points and the compensation data files for storage of the error values.

According to a sixth aspect of the present disclosure, there is further provided a mask or a display substrate manufactured by the method of any of the abovementioned embodiments of the first aspect.

BRIEF DESCRIPTION OF THE DRAWINGS

These and/or other aspects and advantages of the present disclosure will become apparent and more readily appreciated from the following description of the embodiments, taken in conjunction with the accompanying drawings of which.

DETAILED DESCRIPTION OF THE EMBODIMENTS

Technical solutions according to these embodiments of the present disclosure will be described hereinafter in detail and completely with reference to the attached drawings. The same or similar reference numerals throughout the description refer to the same or similar elements. These embodiments of the present disclosure described hereinafter with reference to the attached drawings are provided to explain general inventive concept of the present disclosure, but not to be regarded as limiting the present disclosure.

Further, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
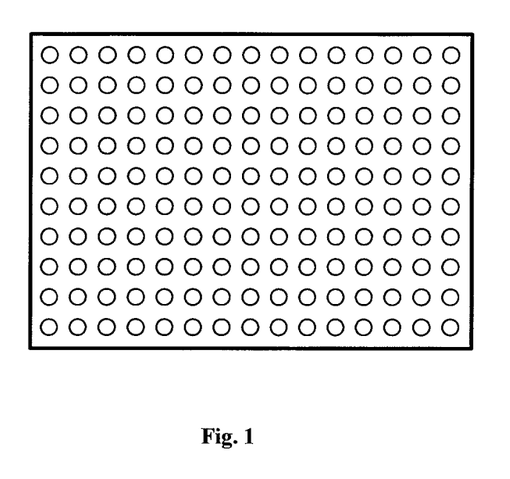
FIG. 1 shows schematically an arrangement of setting measuring points at equal distance on a mask.

Many positioning methods are used to ensure position accuracy of an FMM or alignment of the FMM to a glass. For example, one positioning method is to position location of the FMM by adopting a compensation method. Specifically, in order to determine position accuracy of the FMM on a net machine, a plurality of marks are set on the FMM. Referring to circles shown in FIG. 1, the plurality of marks are namely measuring points in which compensation values are required to be determined. As shown in FIG. 1, the plurality of marks are set at equal distance on the mask.

Figure 2:
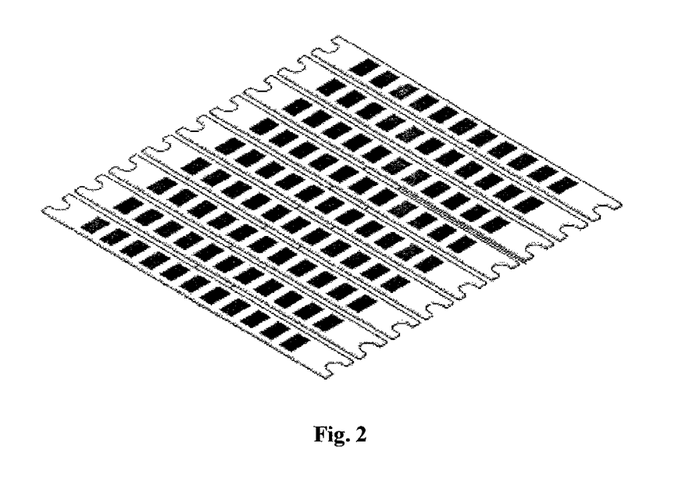
FIG. 2 is a schematic view of a structure of a fine mask.
Figure 3:
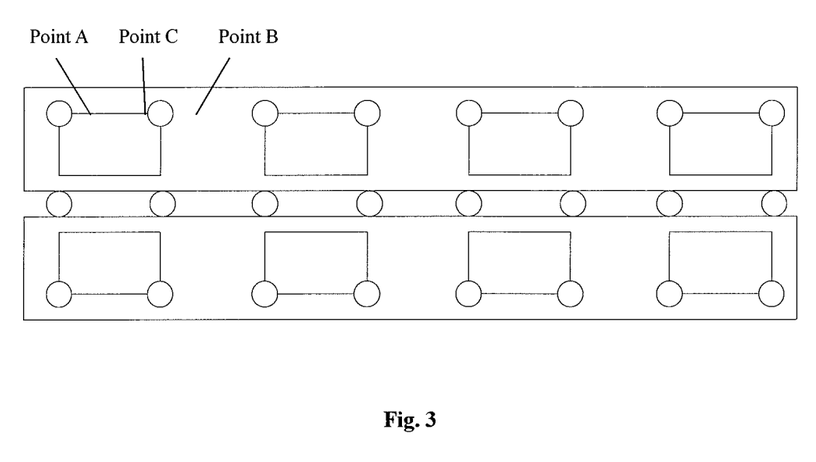
FIG. 3 shows schematically measuring points set at equal distance on the fine mask.

However, referring to FIG. 2, the FMM generally comprises a plurality of mask units with gaps therebetween. If the equal distance arrangement shown in FIG. 1 is adopted, conditions that some marks are set in the gap between two mask units may occur, as shown in FIG. 3. That is, it is possible that, some measuring points are not the points required to being subjected to process control, but some points required to being subjected to process control are not the measuring points.

In this compensation method, referring to FIG. 3, it is unavoidable to implement compensations on a plurality of positions with no marks, and for implementing compensations on non-measuring points, compensation values should be determined by calculation. Calculation process will be described with reference to FIG. 3, point A and point B in FIG. 3 are the marks shown in FIG. 1, process control should be performed on a middle point C between the point A and the point B in a technological process, here, a compensation value at the point C can be calculated by a system according to the following equation:

$$(\Delta x, \Delta y)_3 = \{(\Delta x, \Delta y)_1 + (\Delta x, \Delta y)_2\}/2;$$

in which, $(\Delta x, \Delta y)_1$, $(\Delta x, \Delta y)_2$ and $(\Delta x, \Delta y)_3$ are compensation values of the points A, B, C in a (x, y) coordinate system.

However, since linear condition of the equipment is unstable, for example, once a movement error of the equipment moving from 0 m to 10 m is 10 μm, then, a movement error of the equipment moving from 0 m to 20 m is 20 μm if "linear condition of the equipment is stable", and, the actual movement error of the equipment moving from 0 m to 20 m is probably equal to, greater than or less than 20 μm if "linear condition of the equipment is unstable", namely in an actual condition. Accordingly, an actual compensation value at the point C is probably equal to, greater than or less than $\{(\Delta x, \Delta y)_1 + (\Delta x, \Delta y)_2\}/2$. As a result, it will cause a deviation of the compensation at the point C, which adversely affects position accuracy of the mask.

According to an aspect of general technical concept of the present disclosure, there is provided a method of using an equipment for manufacturing or using a mask or a display substrate, specifically, this method may be an error measuring method of using the equipment for manufacturing or using the mask or the display substrate, an error compensating method of using the equipment for manufacturing or using the mask or the display substrate, and an error measuring and compensating method of using the equipment for manufacturing or using the mask or the display substrate. According to an embodiment, the method may comprise: providing a master plate; a measuring point setting step of: setting, on the master plate, a plurality of measuring points corresponding to positions of the mask or the display substrate where a pixel position accuracy measurement is to be implemented, according to the mask or the display substrate; and an error value measuring step of: placing the master plate in a coordinate system of the equipment, and measuring error values between the equipment and the master plate at the measuring points.

According to an exemplary embodiment of the present disclosure, a mask product 1 manufactured is used as the master plate. Then, referring to FIG. 4, a plurality of measuring points are set on the mask product, and the plurality of measuring points correspond to positions where a process control (namely, a pixel position accuracy measurement, for example to determine compensation values) needs to be implemented. In the embodiment shown in FIG. 4, six marks, namely six measuring points 10, may be set corresponding to each opening region 2. Specifically, a cross section of the opening region 2 has a rectangular shape where four measuring points 10 are respectively set at four corners and two measuring points 10 are respectively set at middle points of longer sides. In this way, six measuring points 10 are set corresponding to each opening region 2, and the six measuring points 10 basically contains the positions where a process control needs to be implemented within each opening region 2. Thus it can be seen, in the embodiments of the present disclosure, the measuring points are not set at equal distance on the master plate, but are set according to requirements of the process control. In this case, there is no need to additionally measure and calculate compensation values at other positions. It should be understood that, different masks require different pixel position accuracies, that is, for different masks, positions for pixel position accuracy measurement may be different. Accordingly, for different types of the masks, different measuring points can be set. That is to say, in the embodiments of the present disclosure, a plurality of measuring points corresponding to positions of a type of the mask where the pixel position accuracy measurement is to be implemented may be set on the master plate according to the type of the mask.

It should be noted that, the master plate may be a correction plate, namely a standard mask, which has higher accuracy and is available in market. The master plate may also be a glass substrate (glass) manufactured in an array process (namely, processes of manufacturing a thin-film transistor, a pixel structure, an array substrate and the like), which generally also has higher accuracy.

Figure 5:
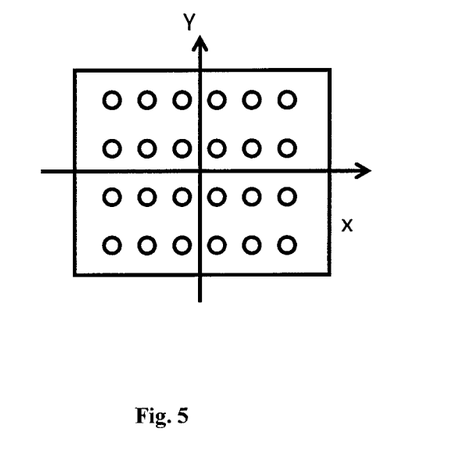
FIG. 5 shows schematically an arrangement of a plurality of measuring points of a master plate in a coordinate system of an equipment.
Figure 6:
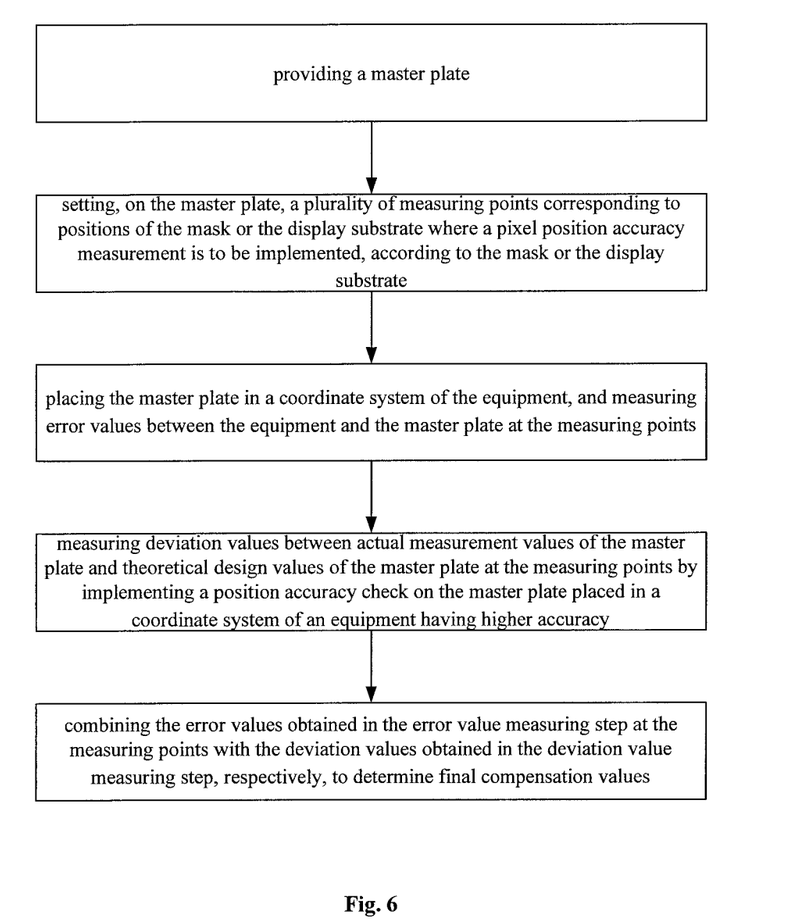
FIG. 6 shows a flow diagram of a method for a mask or a display substrate, according to an embodiment of the present disclosure.

Hereinafter, a method for a mask according to an exemplary embodiment of the present disclosure will be further described with reference to FIGS. 4, 5 and 6. The method may comprise the following steps.

Firstly, a master plate is provided.

Specifically, the master plate may be selected from any one of the above mask product, the correction plate, and the glass substrate manufactured in the array process. The mask product is generally manufactured by the net machine and generally has a lower accuracy than the correction plate and the glass substrate.

It further includes a measuring point setting step of: setting, on the master plate, a plurality of (for example, n, in which $n \geq 32$ and is a natural number) measuring points, according to the mask to be measured.

Specifically, positions where a process control (for example to implement a compensation) needs to be implemented may be determined according to types and structures and the like of the mask to be measured, and the positions where the process control needs to be implemented are determined as the measuring points. In one embodiment, the plurality of measuring points respectively correspond to positions of the mask to be measured where a pixel position accuracy measurement is to be implemented. Then, a plurality of measuring points may also be set on the master plate correspondingly since the measuring points on the master plate correspond one-to-one to the measuring points on the mask to be measured.

Moreover, for types of master plates, there will have theoretical coordinates in their design papers. It should be understood that, there generally have certain deviations between actual coordinates and theoretical coordinates of the types of master plates, in this case, the following deviation value measuring step should be implemented.

It further includes a deviation value measuring step of: measuring deviation values between actual measurement values of the master plate and theoretical design values of the master plate at the measuring points by implementing a position accuracy check on the master plate. For example, in an example, the master plate may be placed in a coordinate system of a check machine or a check equipment having higher accuracy than an equipment of manufacturing a mask, to measure deviation values between actual coordinates (actual measurement values) of the master plate and theoretical design coordinates (theoretical design values) of the master plate at the measuring points.

In order to implement a position accuracy check on the master plate in a check machine, the check machine needs to have higher position accuracy generally than the following equipments to be described. This check machine detects deviations between actual measurement values and theoretical design values of the master plate at the measuring points. For example, in a coordinate system (X, Y) (which may be also named as a second coordinate system herein) of the check machine, a deviation value at an $i^{th}$ (which is a natural number in the range of 1~n) measuring point on the master plate checked by the check machine is $\delta X_i$, $\delta Y_i$.

It should be understood by those skilled in the art that, the deviation value measuring step may be implemented in advance, that is, the deviation values at the measuring points on the master plate may be calculated in advance and then is stored as a data file which corresponds to the type of the master plate and which can be extracted directly as needed without implementing calculation on the spot, so as to save calculation time.

It further includes an error value measuring step of: placing the target in a coordinate system of an equipment (which may be the one for manufacturing or using a mask, for example a net machine), and measuring error values between the equipment and the master plate at the measuring points.

In an embodiment, error values at the measuring points on the master plate may be measured by CCD. As an example, the error values may be errors $\Delta x_i$, $\Delta y_i$ at the measuring points on the master plate in a coordinate system (x, y) of the equipment (which is also named as a first coordinate system herein).

Accordingly, the method according to embodiments of the present disclosure may include the following combining and compensating step of: combining the error values obtained in the error value measuring step at the measuring points with deviation values obtained in the deviation value measuring step at the measuring points, respectively, to determine final compensation values for compensating errors of the equipment at the measuring points.

Since, in the error value measuring step of measuring the error values $\Delta x_i$, $\Delta y_i$ at the measuring points on the master plate in a coordinate system (x, y) of the equipment, no consideration is taken on error of the master plate itself, accordingly, in case that consideration is taken on error of the master plate itself, that is consideration is taken on deviation values $\delta X_i$, $\delta Y_i$ at the measuring points on the master plate checked in a coordinate system (X, Y) of the check machine, the final compensation value should be:

$$(\delta X_i - \Delta x_i, \delta Y_i - \Delta y_i).$$

Figure 4:
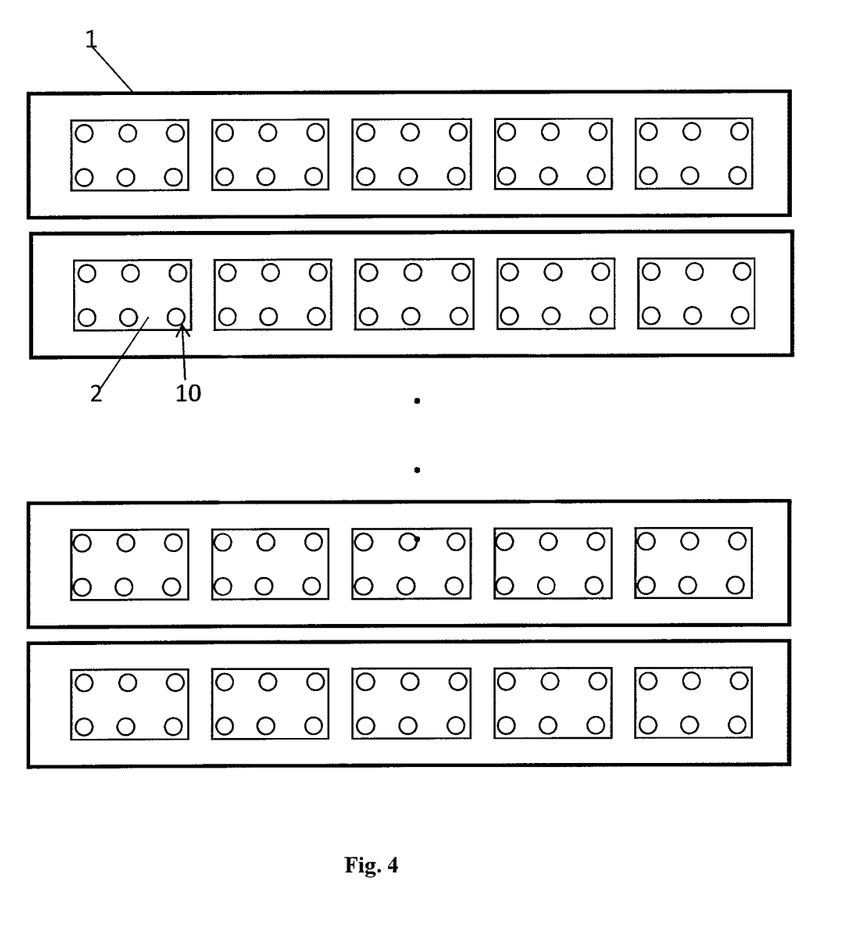
FIG. 4 shows schematically an arrangement of setting measuring points on a fine mask, according to an embodiment of the present disclosure.

For example, taking one measuring point in FIG. 4 as an example, a deviation value at the measuring point on the master plate obtained in the deviation value measuring step is +0.2 μm, −0.1 μm, and, an error value at the measuring point on the master plate obtained in the error value measuring step is +1 μm, +2 μm, then, a final compensation value at this measuring point should be −0.8 μm, −2.1 μm.

Accordingly, each measuring point has its own compensation value. Once the equipment is moved to certain measuring point, an error of the equipment will be compensated by a compensation value corresponding to the certain measuring point, which ensures position accuracy of the measuring points.

In an alternative embodiment, since deviation values of the master plate are much smaller than error values of the mask to be measured, in some occasions with no higher requirements on position accuracy, the deviation value measuring step may be omitted. In that case, the method for the mask according to the embodiments may include the following steps of:

providing a master plate;

a measuring point setting step of: setting a plurality of (for example, n, in which the n≥2 and n is a natural number) measuring points on the master plate, according to the mask to be measured;

an error value measuring step of: placing the master plate in a coordinate system of an equipment (for example, a net machine), and measuring error values between the equipment and the master plate at the measuring points; and a compensating step of: compensating errors of the equipment at the measuring points with the error values obtained in the error value measuring step serving as final compensation values.

Figure 7:
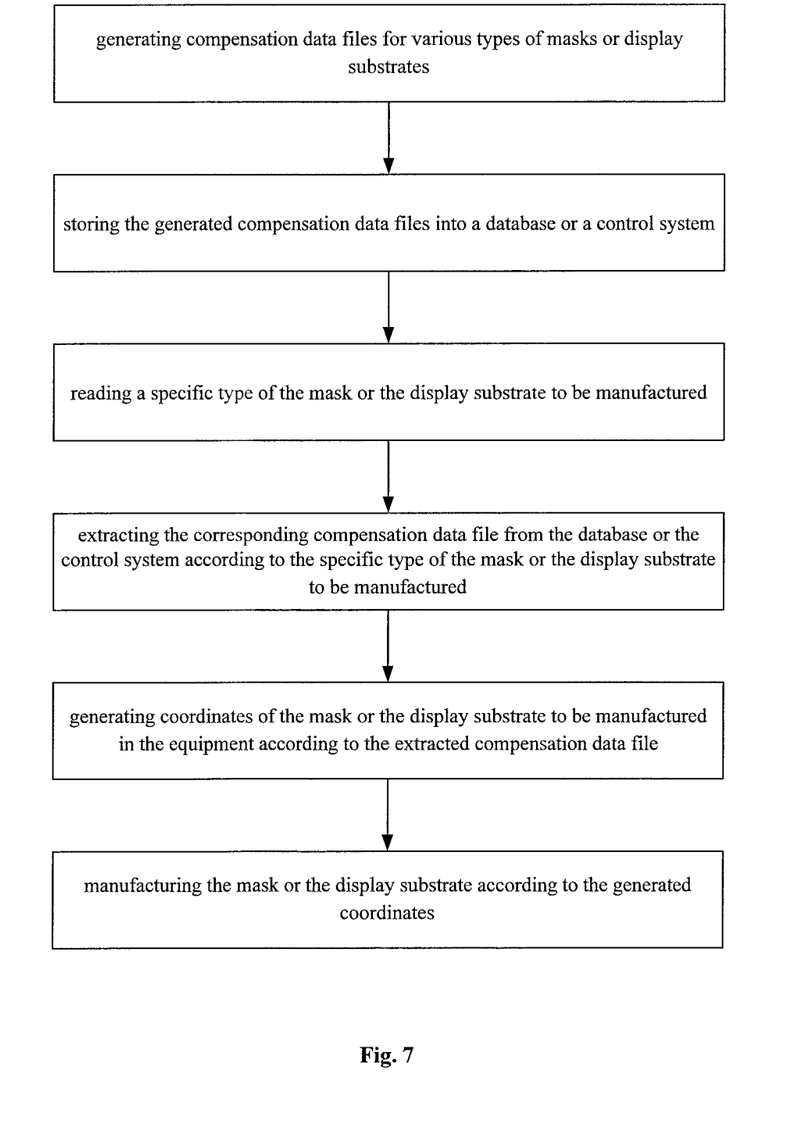
FIG. 7 shows a flow diagram of a method of manufacturing a mask or a display substrate, according to an embodiment of the present disclosure.

Accordingly, according to an embodiment of the present disclosure, there also is provided a method for manufacturing a mask. Referring to FIG. 7, the manufacturing method may comprise steps of:

generating, by implementing the abovementioned method on types of masks, respectively, compensation data files for the types of the masks to be manufactured;

storing the generated compensation data files into a database or a control system;

reading a specific type of the mask to be manufactured;

extracting the corresponding compensation data file from the database or the control system according to the specific type of the mask to be manufactured;

generating coordinates of the mask to be manufactured in the equipment according to the extracted compensation data file; and manufacturing the mask according to the generated coordinates.

In one embodiment, the types of the masks may be divided according to the pixel position accuracy.

Furthermore, according to another embodiment of the present disclosure, there also is provided a system of using an equipment for manufacturing or using a mask or a display substrate, the system comprising:

a setting module configured for: setting, on the master plate, a plurality of measuring points according to the mask or the display substrate, the plurality of measuring points corresponding to positions of the mask or the display substrate where a pixel position accuracy measurement is to be implemented; and a measuring module configured for: measuring error values between the equipment and the master plate at the measuring points.

In an example, the system further comprises a compensation module configured for: compensating errors of the equipment at the measuring points with the error values obtained by the measuring module serving as final compensation values.

In another example, the measuring module is further configured for: measuring deviation values between actual measurement values of the master plate and theoretical design values of the master plate at the measuring points by implementing a position accuracy check on the master plate. And, the above system further comprises a combining module configured for: combining the error values obtained by the measuring module at the measuring points with the deviation values obtained by the measuring module at the measuring points, respectively, to determine final compensation values for compensating errors of the equipment at the measuring points.

Although embodiments of the present disclosure have been described hereinabove by taking a mask as an example, in other embodiments, the abovementioned method and system may also be for a display substrate to measure and compensate error of the display substrate, for example, the display substrate may include an array substrate, a color filter substrate and the like.

Although embodiments of the present disclosure have been described hereinabove by taking manufacturing of a mask as an example, the abovementioned method and system may also be for an equipment of using the mask or the display substrate, for example, the abovementioned method and system may also be for an equipment of alignment of the mask and the display substrate or other substrates.

Although the present disclosure has been described in conjunction with the drawings, these embodiments disclosed in the drawings intend to exemplarily illustrate embodiments of the present disclosure, but not to be regarded as limiting the present disclosure.

Although some embodiments of the general inventive concept of the present disclosure have been shown and described, it will be apparent, however, for those skilled in the art that changes on these embodiments may be made in these embodiments without departing from the principles and spirit of the general inventive concept of the present disclosure, the scope of which is defined in the claims and their equivalents.

What is claimed is:

1. A method of using an equipment for manufacturing or using a mask or a display substrate, the method comprising:

providing a master plate;

measuring deviation values between actual measurement values of the master plate and theoretical design values of the master plate at the measuring points by implementing a position accuracy check on the master plate;

setting a plurality of measuring points on the master plate, wherein the plurality of measuring points correspond to positions of the mask or the display substrate where a pixel position accuracy measurement is to be implemented, according to the mask or the display substrate;

placing the master plate in a coordinate system of the equipment, measuring error values between the equipment and the master plate at the measuring points; and compensating errors of the equipment at the measuring points with, final compensation values determined by combining the error values obtained in the measuring error values at the measuring points with the deviation values obtained in the measuring deviation values, respectively.

2. The method of claim 1, wherein:

n measuring points are set in the setting measuring points, in which n is a natural number greater than 2;

components of an error value at an $i^{th}$ measuring point obtained in the measuring error values in a first coordinate system (x, y) are $\Delta x_i$ and $\Delta y_i$, respectively, in which i is a natural number in the range of 1~n;

components of the deviation value at the $i^{th}$ measuring point obtained in the measuring deviation values in a second coordinate system (X, Y) are $\delta X_i$ and $\delta Y_i$, respectively, in which i is a natural number in the range of 1~n; and the compensating errors specifically comprises calculating the final compensation value $\Sigma X_i$, $\Sigma Y_i$ at the $i^{th}$ measuring point by the following equation:

$\Sigma X_i = \delta X_i - \Delta x_i$;

$\Sigma Y_i = \delta Y_i - \Delta y_i$.

3. The method of claim 1, wherein, the master plate is one selected from a standard correction plate, a glass substrate corresponding to the mask or the display substrate, or a mask product or a display substrate product.

4. The method of claim 1, wherein, the measuring deviation values is implemented in advance, and then, in the measuring error values, the measured deviation values are automatically imported into a system by which the method is implemented.

5. A method for manufacturing a mask or a display substrate, the manufacturing method comprising:

generating, by implementing the method of claim 1, compensation data for the mask or the display substrate to be manufactured;

generating coordinates of the mask or the display substrate to be manufactured in the equipment according to the generated compensation data; and manufacturing the mask or the display substrate according to the generated coordinates.

6. The method of claim 5, wherein, the master plate is one selected from a standard correction plate, a glass substrate corresponding to the mask or the display substrate, or a mask product or a display substrate product.

7. A mask or a display substrate manufactured by the method of claim 5.

8. A method for manufacturing a mask or a display substrate, the manufacturing method comprising:

generating, by implementing the method of claim 1 on types of masks or display substrates, respectively, compensation data files for the types of the masks or the display substrates to be manufactured;

storing the generated compensation data files into a database or a control system;

reading a specific type of the mask or the display substrate to be manufactured;

extracting the corresponding compensation data file from the database or the control system according to the specific type of the mask or the display substrate to be manufactured;

generating coordinates of the mask or the display substrate to be manufactured in the equipment according to the extracted compensation data file; and manufacturing the mask or the display substrate according to the generated coordinates.

9. The method of claim 8, wherein, the types of the masks or the display substrates are divided according to pixel position accuracy.

10. The method of claim 8, wherein, the master plate is one selected from a standard correction plate, a glass substrate corresponding to the mask or the display substrate, or a mask product or a display substrate product.

11. A mask or a display substrate manufactured by the method of claim 8.

12. An error measuring and/or compensating system for a mask or a display substrate, and the system comprises: a controller configured to carry out the method of claim 1; and a database including the error values between the equipment and the master plate at the measuring points and the compensation data files for storage of the error values.

* * * * *